(12) United States Patent   (10) Patent No.: US 7,484,964 B2
Walker et al.   (45) Date of Patent: Feb. 3, 2009

(54) ELECTRICAL CONNECTOR ASSEMBLY WITH FLOATABLY ARRANGED WAFER

(75) Inventors: Kevin E. Walker, Hershey, PA (US); Joanne E. Shipe, Harrisburg, PA (US); Tod M. Harlan, Mechanicsburg, PA (US); Brian J. Gillespie, Harrisburg, PA (US); Darrell Wertz, Chandler, AZ (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/810,818

(22) Filed: Jun. 7, 2007

(65) Prior Publication Data

US 2008/0305656 A1   Dec. 11, 2008

(51) Int. Cl.
*H01R 13/60* (2006.01)
(52) U.S. Cl. ........................................................ 439/41
(58) Field of Classification Search .................... 439/41, 439/70, 71, 526, 525, 342
See application file for complete search history.

(56) References Cited

U.S. PATENT DOCUMENTS

| 4,395,084 | A | * | 7/1983 | Conrad ........................ 439/331 |
| 4,433,886 | A | * | 2/1984 | Cassarly et al. ............... 439/65 |
| 4,504,887 | A | * | 3/1985 | Bakermans et al. ......... 361/758 |
| 4,593,961 | A | * | 6/1986 | Cosmo ........................ 439/66 |
| 5,078,610 | A | * | 1/1992 | Matsuoka et al. ............. 439/70 |
| 5,885,101 | A | * | 3/1999 | Matsuoka et al. ........... 439/526 |
| 6,431,877 | B1 | * | 8/2002 | Lemke et al. ................. 439/70 |
| 6,974,346 | B2 | * | 12/2005 | Liao ........................... 439/342 |
| 7,021,945 | B2 | * | 4/2006 | Perugini et al. ............... 439/74 |
| 7,140,890 | B1 | * | 11/2006 | Ju ............................... 439/135 |
| 2007/0082513 | A1 | * | 4/2007 | Zheng ......................... 439/70 |

* cited by examiner

*Primary Examiner*—Hae Moon Hyeon
(74) *Attorney, Agent, or Firm*—Wei Te Chung

(57) ABSTRACT

Provided is an electrical connector assembly comprises a supporting frame defining different sections arranged adjacent to each other. Each has generally a rectangular configuration with supporting surfaces along inner peripheral. A plurality of wafers each is supportively received in the section along its bottom edges by the supporting surfaces. Each wafer includes a plurality of contact terminals each arranged in the wafer. Each contact terminal has a tail portion extending beyond the bottom surface. A pick-up cap is properly attached to the supporting frame to position the wafer.

19 Claims, 7 Drawing Sheets

ELECTRICAL CONNECTOR ASSEMBLY WITH FLOATABLY ARRANGED WAFER

BACKGROUND OF THE INVENTION

1. Field of the Invention

The present invention relates to an electrical connector assembly, and more particularly, to an electrical connector assembly with wafers floatably arranged thereon.

2. Description of the Prior Art

U.S. Pat. No. 5,722,848 issued to Lai on Mar. 3, 1998 discloses a typical connector socket, and which is generally referred to as Zero Insertion Force (ZIF) socket. In generally, the socket generally includes a base with a plurality of contacts assembled therein, and a cover moveably attached to the base. A lever along with a cam mechanism is arranged between the base and cover so as to drive the cover from a first position to a second position. When the lever is located in a vertical position, the cover is located at the first position, in which a hole in the cover is completely in align with a corresponding passageway in the base. In this position, a pin leg of a Central Process Unit (CPU) can be inserted from the cover into the passageway without any engagement with the contact. When the CPU is properly seated on the cover, then the lever is moved from the vertical position to a horizontal position, and simultaneously driving the cover from the first position to the second position. During this process, the pin leg of the CPU is then in contact with the contact within the base.

U.S. Pat. No. 7,001,197 issued to Shirai on Feb. 21, 2006 discloses another type of connector socket, and which can be generally called Land Grid Array (LGA) socket. As clearly shown in Figures, the socket generally includes a metal stiffener with a housing securely supported therein. Then a metal clip is pivotally assembled to the stiffener. On the other hand, a clip is pivotally assembled to the other side of the stiffener and when the clip is closed to the stiffener, the lever having a cam can lock the clip to a closed position. By this arrangement, if before the clip is closed, and a CPU is seated on the housing, then the clip will tightly press the CPU toward the housing ensuring proper electrical connection therebetween.

In design the Lai and Shirai sockets, one of the factors, coefficient of thermal expansion (CTE), mismatch is a key factor which may materially effect the design and performance of the socket. As a matter of fact, a CTE of a printed circuit board, and a CTE of socket are different from each other. When the CPU become more and more powerful, heat generated thereon become more and more higher, and the CTE mismatch is really an issue for the designer.

U.S. Pat. No. 6,679,707 issued to Brodsky et al, discloses another configuration of connector socket for interconnecting a CPU to a printed circuit board. In Lai and Shirai disclosures, solder or solder ball are applied, while in Brodsky's disclosure, no solder has been applied. It is generally called LGA-LGA type, or compression type. Since no solder is applied to a contact tail, the contact can move along with the housing. Accordingly, this can reduce the issue of CTE mismatch.

Since the CPU become more and more powerful, input and output ports are increased as well. For a typical Socket 478, it has four hundred seventy-eight contacts. For a Socket T, which is a main trend of the CPU socket available to the market nowadays, it has seven hundred seventy-five contact terminals. In some server application, the contact terminals have exceed one thousand, even exceed seven thousand.

When dealing such a huge amount of contact terminals, it would be impractical to put them all into a single housing in view of CTE mismatch, contact tails coplanarity, etc. As a result, the housing is divided into different units or sections. As disclosed in the Brodsky '707 patent, the housing is divided into four sections, and each interconnected with each other. As discussed above, Brodsky discloses a LGA-LGA type contact, CTE mismatch is not a material issue. If the industry intends to adopt Bordsky's configuration for Lai and Shirai socket, in which solder or solder balls are applied, then CTE mismatch is a grave concern.

SUMMARY OF THE INVENTION

It is an object of the present invention to provide a configuration for high volume contacts connector socket, in which CTE mismatch can be properly addressed.

In order to achieve the object set forth, an electrical connector assembly comprises a supporting frame defining different sections arranged adjacent to each other. Each has generally a rectangular configuration with supporting surfaces along inner peripheral. A plurality of wafers each is supportively received in the section along its bottom edges by the supporting surfaces. Each wafer includes a plurality of contact terminals each arranged in the wafer. Each contact terminal has a tail portion extending beyond the bottom surface. A pick-up cap is properly attached to the supporting frame to position the wafer.

BRIEF DESCRIPTION OF THE DRAWINGS

Other objects, advantages and novel features of the present invention will become more apparent from the following detailed description when taken in conjunction with the accompanying drawings, in which.

DESCRIPTION OF PREFERRED EMBODIMENT OF THE INVENTION

Figure 1:
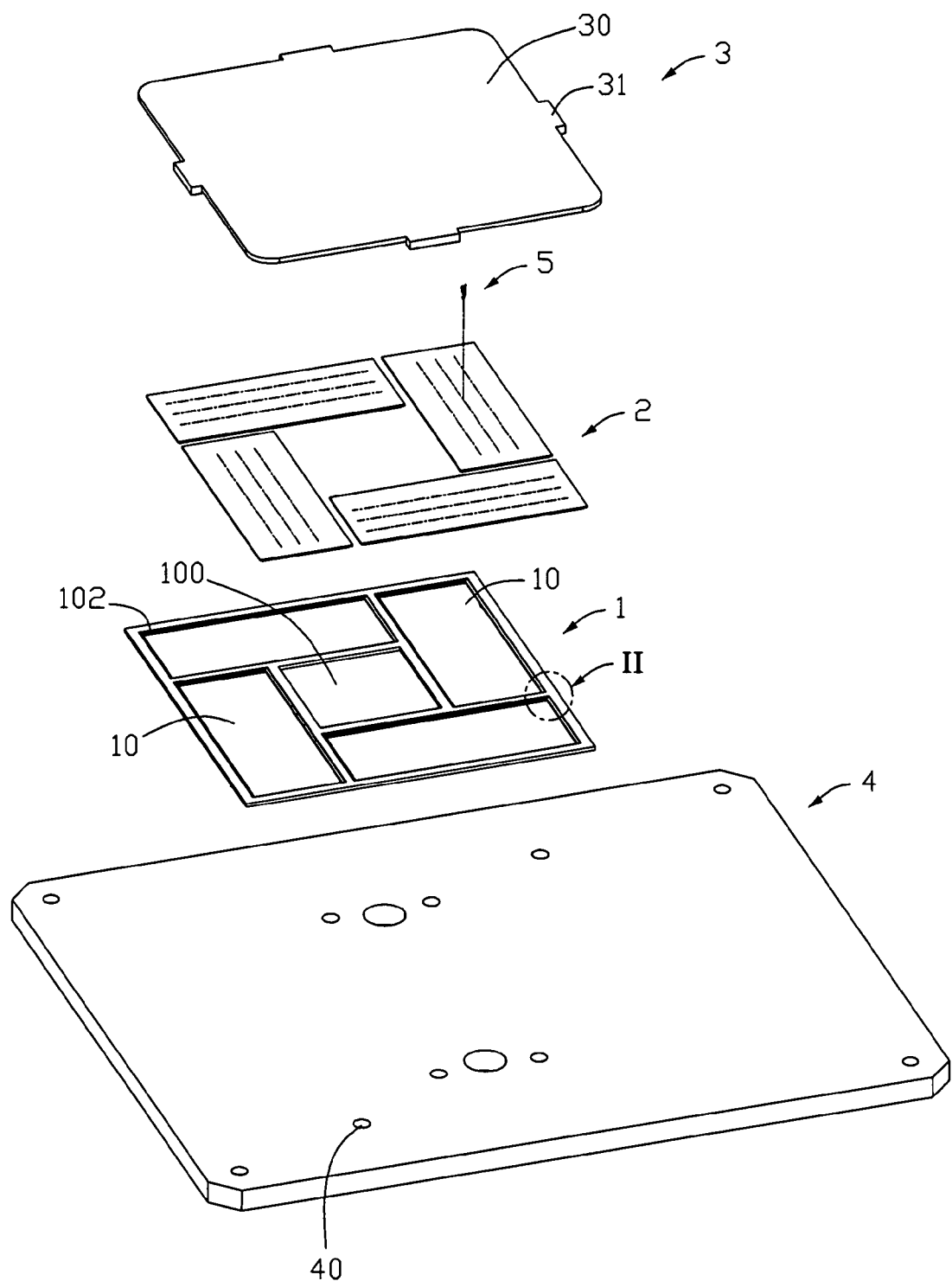
FIG 1 is an exploded view of an electrical connector assembly in accordance with a preferred embodiment of the present invention.
Figure 2:
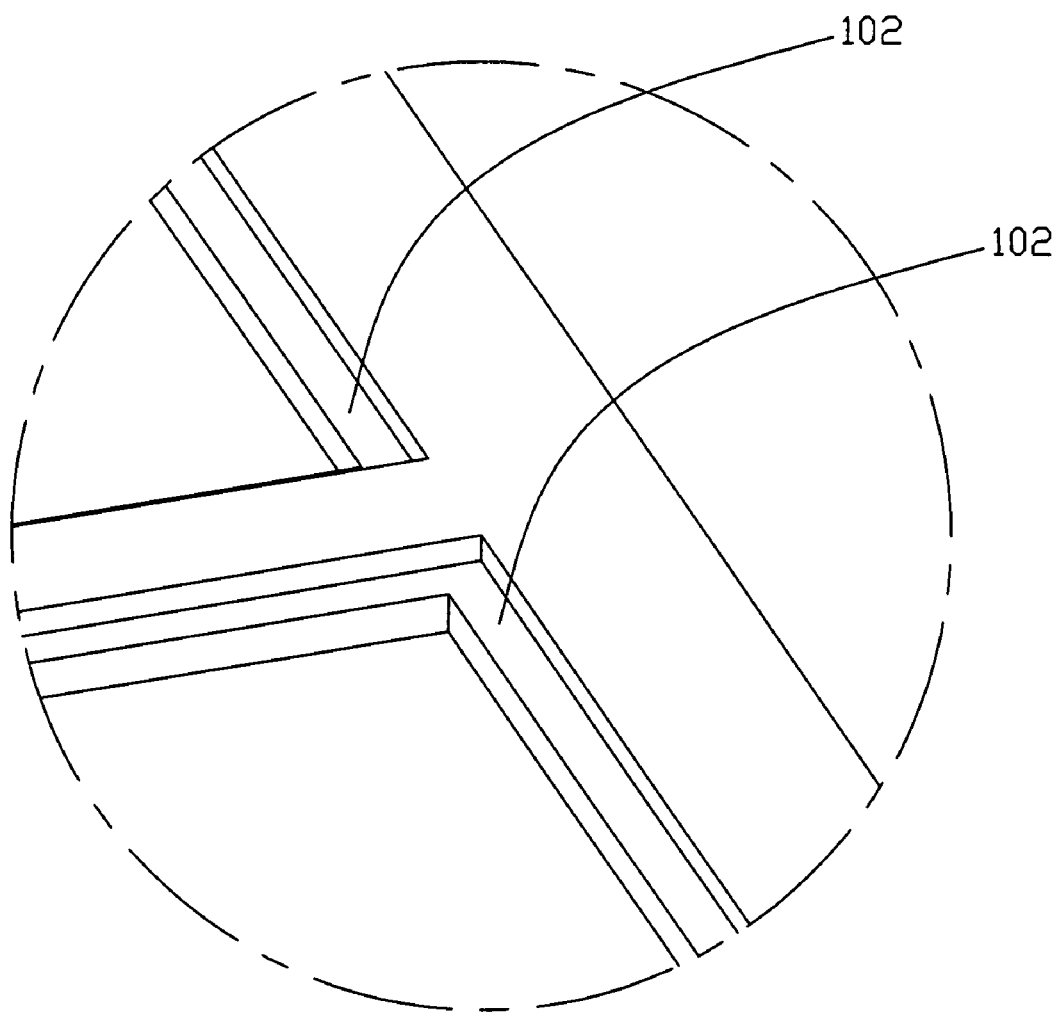
FIG. 2 is an enlarged view encircled in FIG. 1.

Reference will now be made to the drawings to describe of a preferred embodiment of the present invention in detail.

Referring to FIG. 1 to FIG. 7, an electrical connector assembly in accordance with a preferred embodiment of present invention is adapted for electrically connecting a chip module to a circuit substrate such as a printed circuit board (PCB) 4. The electrical connector assembly comprises a supporting frame 1 defining different sections 10 arranged adjacent to each other, a plurality of wafers 2 each supportively received in the section 10, a plurality of contact terminals 5 arranged in the wafer 2, a printed circuit board 4 provided for bearing the supporting frame 1 assembled the wafers 2 thereon and a pick-up cap 3 properly attached to the supporting frame 1 to position the wafer 2.

The supporting frame 1 has a top surface and a bottom surface, and is separated into four sections 10 and jointly defines a central opening 100 there between. Each section 10 has a general rectangular configuration and each is perpendicular to an adjacent section 10. Each section 10 including supporting surfaces 102 with an inner rim serving as the supporting surface 102. The central opening 100 is used to dissipate the heat produced by the wafers 2 and the printed circuit board 4. In addition, the supporting frame 1 defines a pair of locating pins 104 on the bottom surface for positioning the wafers 2 to the printed the circuit board.

Each wafer 2 is configured as substantially rectangular shape with supportively received in the section 10 along its bottom edges by the supporting surfaces 102, each wafer including a plurality of contact terminals 5 each arranged in the wafer 2 and each contact terminal 5 having a tail portion. A number of solder balls attached to the tail portion of contact terminals 5 for being soldered with the corresponding solder pads on the printed circuit board 4.

The pick-up cap 3 is figured into a rectangular shape and includes a flat planar plane 30 with two hooks 31 extending downwardly from each lateral side thereof for picking up the supporting frame 1. The pick-up cap 3 can be use for properly attaching to the supporting frame 1 to position the wafer 2.

Figure 3:
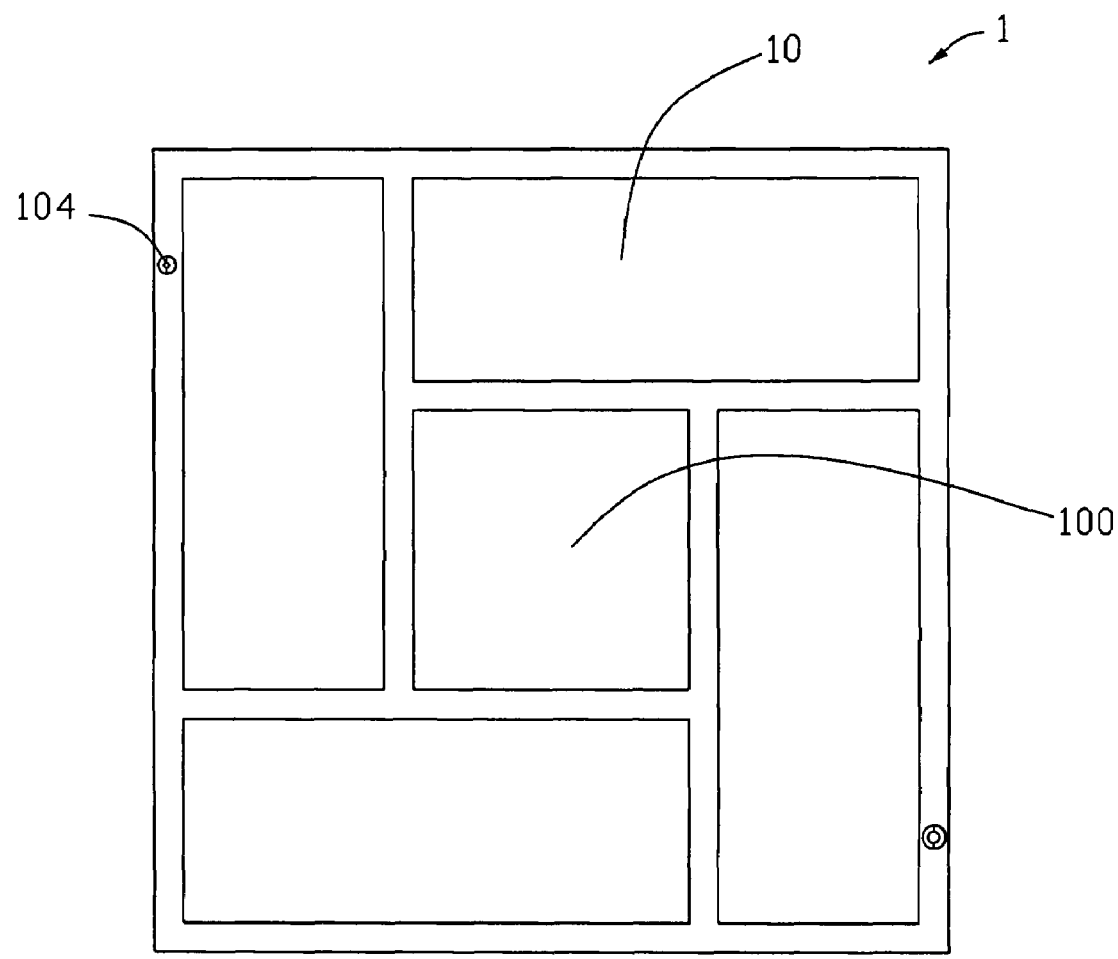
FIG. 3 is a top view of a supporting frame disclosed in FIG. 1.
Figure 4:
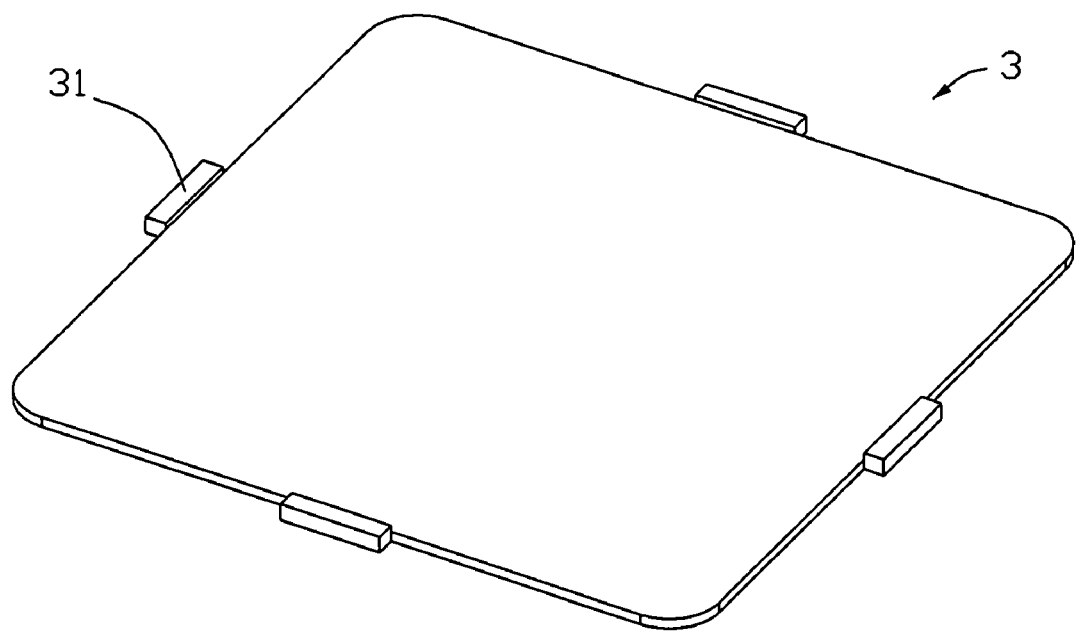
FIG. 4 is a pick-up cap made in accordance with the present invention.
Figure 5:
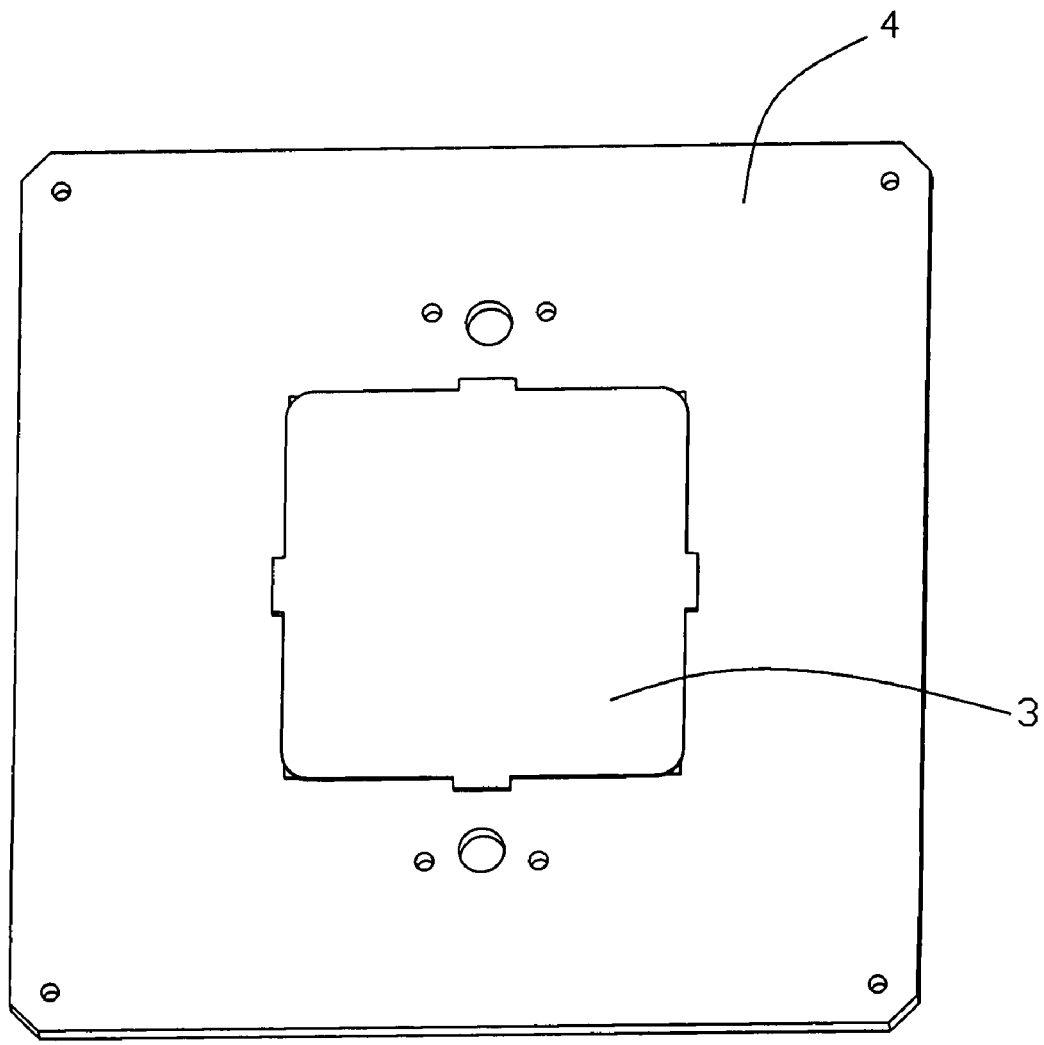
FIG. 5 is a top view of the assembly with the pick-up cap attached to the supporting frame.
Figure 6:
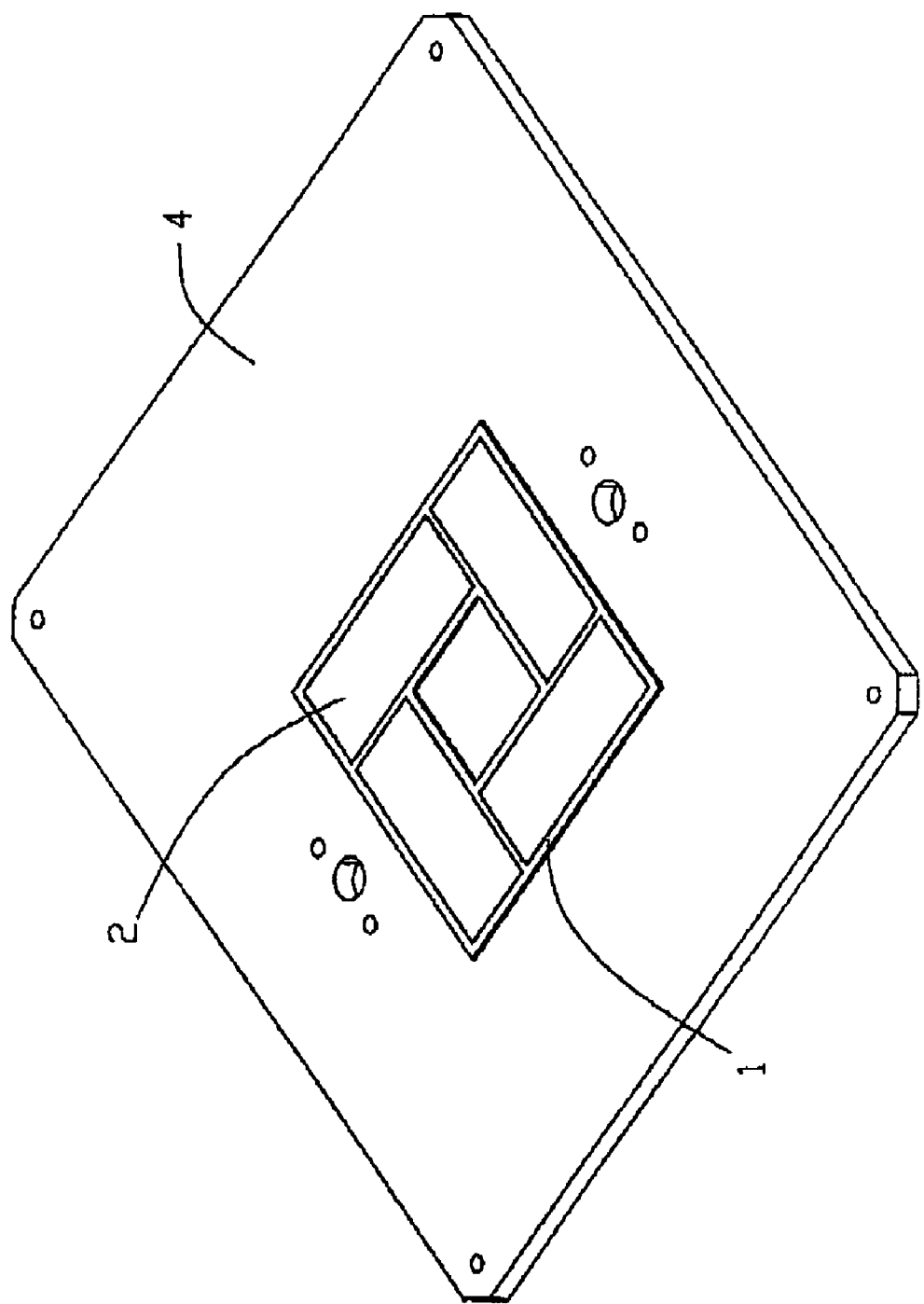
FIG. 6 is an assembled view of the electrical assembly in accordance with a preferred embodiment of the present invention.
Figure 7:
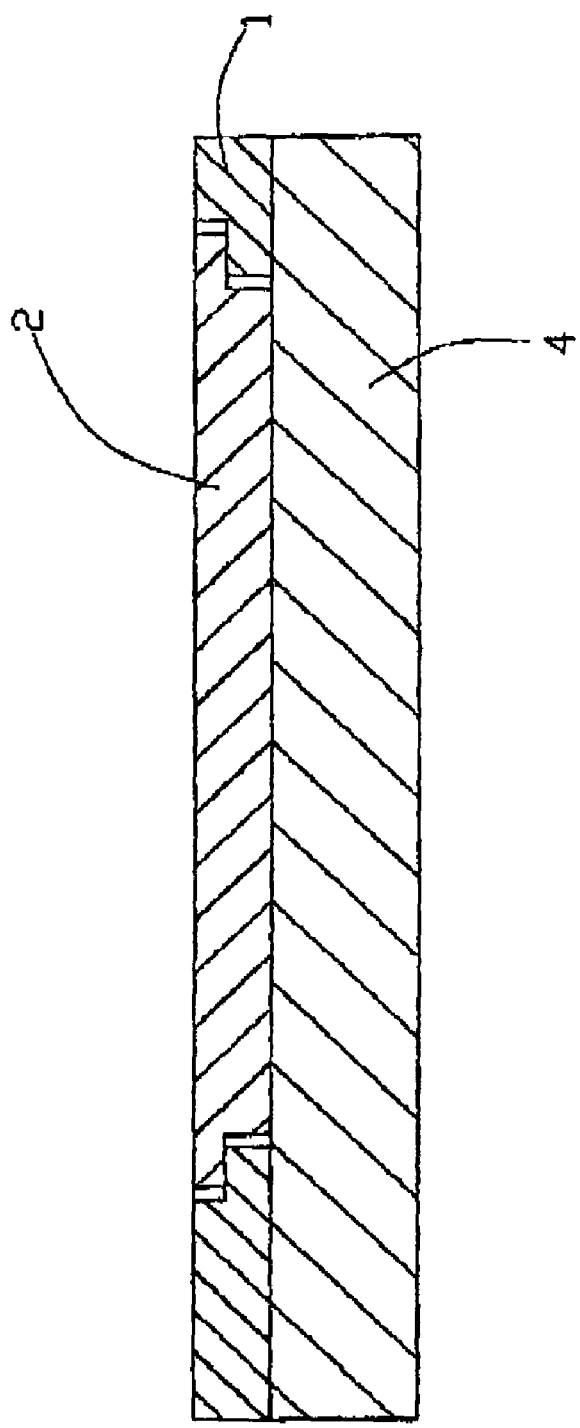
FIG. 7 is a cross-sectional view taken through FIG. 6 showing the relationship of wafer and the section of the supporting frame.

Referring to FIG. 1 and FIG. 3, in assembly, the wafers 2 are firstly received in the sections 10 of the supporting frame 1 along its bottom edges by the supporting surface 102. Then the pick-up cap 3 covered on the top surface of the supporting frame 1 assembled the wafers 2 with the hooks 31 interferingly engaging with lateral sidewalls of the supporting frame 1 to move the supporting frame 1 to the predetermined place of the printed circuit board 4 by a vacuuming device. The pick-up cap 3 simultaneously prevents the wafers 2 from falling out of the top side of the supporting frame 1 during shipping and handling. When the supporting frame 1 disposed on the printed circuit board 4, the locating pins 104 of the supporting frame 1 are inserted into the receiving hole 40 of the printed circuit board 4 for the solder balls of the contact terminals 5 being soldered with the corresponding solder pads on the circuit board 4. After the wafers 2 are reflowed to the PCB 4, the pick-up cap 3 is no longer necessary to retain the wafers 2.

In this invention, a plurality of wafers 2 are received in the sections 10 of the supporting frame 1 floatingly. Each floating wafer 2 can freely float within the supporting frame 1 before it is soldered. Each floating wafer 2 is laid on the supporting surfaces 102 with a gap between floating wafer 2 and the inner rim of the supporting frame 1, thus the wafer 2 can be floated in horizontal direction. The final position of each wafer 2 is dictated by the self-centering effect of the solder balls to their corresponding PCB solder pads. Each wafer 2 is ultimately located by its corresponding array of solder pads, which can be very accurately manufactured by PCB vendors. As a result, smaller wafers 2 can be manufactured, each one more accurate than a single large wafer 2 or array, and each of these wafers 2 can be precisely located on the board 4 by the accurate location of PCB solder pads.

It is common knowledge in the industry that PCBs and connectors generally have different coefficients of thermal expansion. This characteristic can induce stress in the solder joints as the board and connector are subjected to heating and cooling cycles. This becomes a concern in larger connectors because the difference in the dimensional growth of board versus the dimensional growth of the connector becomes more significant as the size increases. In this invention, as the board 4 and wafers 2 are heated or cooled, each wafers 2 is free to move individually within the clearance designed in the frame 1. Using this method, the CTE stress on the entire ball grid array socket or connector is only as much as that which is experienced in each of the small individual arrays that the entire connector is composed of. There is no stress induced between wafers 2; stress occurs only within each small wafer 2.

What is claimed is:

1. An electrical connector assembly, comprising:
   a supporting frame defining different sections arranged adjacent to each other, and a number of supporting surfaces extending from the inner edges of each section, the supporting frame having a bottom surface;
   a plurality of wafers each supportively received in the section along its bottomed edges by the supporting surfaces, each wafer carrying a plurality of contact terminals each arranged in the wafer, each contact terminal having a tail portion, and the wafers are respectively floatable in the corresponding receiving sections before the terminals are soldered to the printed circuit board; and
   a pick-up cap properly attached to the supporting frame to position the wafer.

2. The assembly as recited in claim 1, wherein each section includes an inner rim serving as the supporting surface.

3. The electrical connector assembly as recited in claim 1, wherein each of the contact terminals is adapted for being attached with a solder ball.

4. The electrical connector assembly as recited in claim 1, wherein the pick-up cap includes hooks releasably secured to the supporting frame.

5. The electrical connector assembly as recited in claim 1, wherein each section has a general rectangular configuration.

6. The electrical connector assembly as recited in claim 5, wherein each section is perpendicular to an adjacent section.

7. The electrical connector assembly as recited in claim 6, wherein there are four sections and jointly defines a central opening therebetween.

8. An electrical connector assembly comprising:
   a printed circuit board;
   a supporting frame defining different receiving sections arranged adjacent to each other, each of said receiving sections including upward supporting ridges and a bottom surface; and
   a plurality of wafers each supportively received in the corresponding receiving section by the supporting ridges, each wafer carrying a plurality of contact terminals each arranged in the wafer an having a tail portion, and the wafers are respectively floatable in the corresponding receiving sections before the terminals are soldered to the printed circuit board; wherein
   the tail portions of said terminals are soldered upon and secured to the printed circuit board.

9. The assembly as claimed in claim 8, wherein the wafers are allowed to be removed away from the frame before said terminals are soldered to the printed circuit board.

10. The assembly as claimed in claim 8, further including a pick up cap which retainably sits upon the frame and the associated wafers to the printed circuit board under a condition that the pick up cap prevents the upward withdrawal of the wafer from the frame.

11. The assembly as claimed in claim 10, wherein the wafers are circumferentially compliantly received in the corresponding receiving sections, respectively.

12. The assembly as claimed in claim 8, wherein the frame defines a retention post inserted into the a hole in the printed circuit board during assembling.

13. The assembly as claimed in claim 10, wherein a dimension of the frame is similar to that of the pick up cap.

14. An electrical connector assembly comprising:

a printed circuit board;

a supporting frame defining different receiving sections arranged adjacent to each other, each of said receiving sections including upward supporting ridges essentially commonly fully circumscribing the corresponding receiving section, and a bottom surface which confronts the printed circuit board; and a plurality of wafers each supportively received in the corresponding receiving section by the supporting ridges, each wafer carrying a plurality of contact terminals each arranged in the wafer an having a tail portion, and the wafers are respectively floatable in the corresponding receiving sections before the terminals are soldered to the printed circuit board;

the tail portions of said terminals are soldered upon and secured to the printed circuit board; wherein the frame defines a retention section coupled to the printed circuit board.

15. The assembly as claimed in claim 14, wherein the wafers are not allowed to be downwardly but upwardly withdrawn from the corresponding receiving section.

16. The assembly as claimed in claim 15, further including a pick up cap assembled upon the frame defining a plate for not only suction by a nozzle during mounting the frame and the associated wafers to the printed circuit board, but also preventing upward withdrawal of the wafers away from the frame before mounting the frame and the associated wafers to the printed circuit board.

17. The assembly as claimed in claim 14, wherein the upward supporting ridges in each of the receiving sections provides one continue surface.

18. The assembly as claimed in claim 14, wherein the upward supporting ridges in each of the receiving sections is defined spaced serially in an inner rim of the receiving sections.

19. The assembly as claimed in claim 14, wherein the wafers are circumferentially compliantly received in the corresponding receiving sections, respectively.

* * * * *